US012704534B2

(12) United States Patent
An et al.

(10) Patent No.: US 12,704,534 B2
(45) Date of Patent: Aug. 11, 2026

(54) SUPERCONDUCTING IMPEDANCE MATCHED PARAMETRIC AMPLIFIER

(71) Applicant: Tencent Technology (Shenzhen) Company Limited, Shenzhen (CN)

(72) Inventors: Shuoming An, Shenzhen (CN); Maochun Dai, Shenzhen (CN); Jingjing Hu, Shenzhen (CN); Wenlong Zhang, Shenzhen (CN); Dengfeng Li, Shenzhen (CN); Shengyu Zhang, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 169 days.

(21) Appl. No.: 18/814,238

(22) Filed: Aug. 23, 2024

(65) Prior Publication Data

US 2024/0418758 A1 Dec. 19, 2024

Related U.S. Application Data

(63) Continuation of application No. PCT/CN2023/095810, filed on May 23, 2023.

(30) Foreign Application Priority Data

Jul. 8, 2022 (CN) ........................ 202210815436.0

(51) Int. Cl.
*G01R 27/16* (2006.01)
*H03F 1/56* (2006.01)
(Continued)

(52) U.S. Cl.
CPC ............... *G01R 27/16* (2013.01); *H03F 1/56* (2013.01); *H03F 7/00* (2013.01); *H03F 19/00* (2013.01)

(58) Field of Classification Search
CPC ... G01R 27/16; H03F 1/56; H03F 7/00; H03F 19/00; G06F 30/373; G06F 30/367; G06N 10/00; G06N 10/40
(Continued)

(56) References Cited

U.S. PATENT DOCUMENTS

2018/0232653 A1* 8/2018 Selvanayagam ........ H01P 5/028
2021/0279395 A1* 9/2021 Rawat .................. G06F 30/367
2024/0289666 A1* 8/2024 Naaman ................ G06N 10/40

FOREIGN PATENT DOCUMENTS

CN 108259014 A 7/2018

OTHER PUBLICATIONS

International Search Report and Written Opinion received for PCT Patent Application No. PCT/CN2023/095810, mailed on Jun. 23, 2023, 13 pages (5 pages of English Translation and 8 pages of Original Document).

(Continued)

*Primary Examiner* — Roberto Velez
(74) *Attorney, Agent, or Firm* — ARENTFOX SCHIFF LLP

(57) ABSTRACT

In a method for determining a superconducting impedance matched parametric amplifier, a center wavelength parameter, a gain parameter, and a bandwidth parameter of the superconducting impedance matched parametric amplifier are determined. An impedance value of an impedance matching line of the superconducting impedance matched parametric amplifier and a capacitance value of the amplifier are determined based on the wavelength parameter, the gain parameter, and the bandwidth parameter. A line width dimension of a coplanar waveguide of the superconducting impedance matched parametric amplifier is calculated based on the impedance value of the impedance matching line. A stub dimension of the superconducting impedance matched parametric amplifier is calculated based on the impedance (Continued)

value of the impedance matching line and the capacitance value of the amplifier. Structural parameters of the superconducting impedance matched parametric amplifier are determined based on the line width dimension and the stub dimension.

20 Claims, 4 Drawing Sheets

(51) Int. Cl.
*H03F 7/00* (2006.01)
*H03F 19/00* (2006.01)

(58) Field of Classification Search
USPC .......................................................... 324/722
See application file for complete search history.

(56) References Cited

OTHER PUBLICATIONS

Extended European Search Report and Search Opinion received for European Application No. 23834530.0, mailed on Jan. 24, 2025, 11 pages.

* cited by examiner

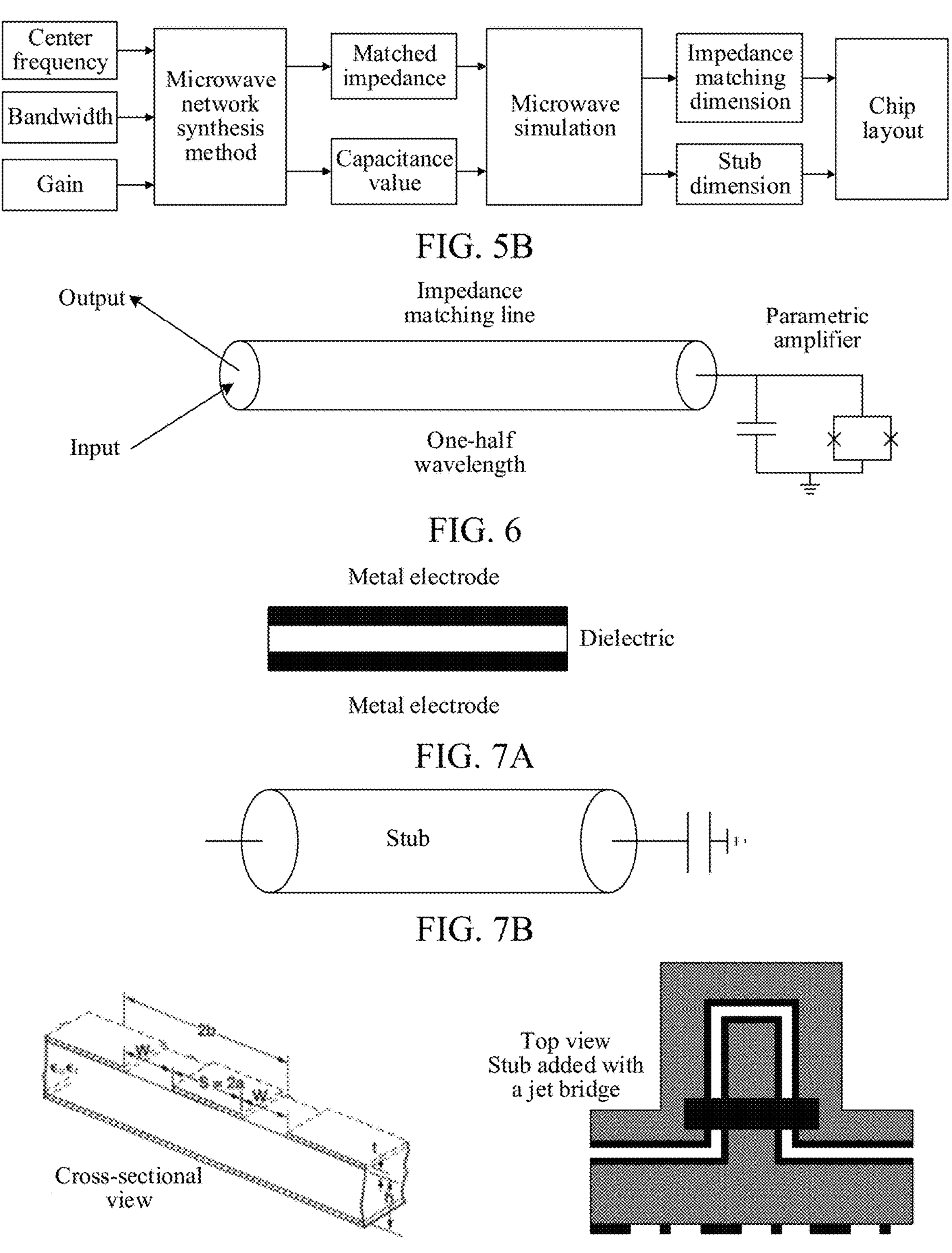
Center frequency
Bandwidth
Gain
Microwave network synthesis method
Matched impedance
Capacitance value
Microwave simulation
Impedance matching dimension
Stub dimension
Chip layout
FIG. 5B
Output
Input
Impedance matching line
One-half wavelength
Parametric amplifier
FIG. 6
Metal electrode
Dielectric
Metal electrode
FIG. 7A
Stub
FIG. 7B
Cross-sectional view
Top view
Stub added with a jet bridge
FIG. 7C

SUPERCONDUCTING IMPEDANCE MATCHED PARAMETRIC AMPLIFIER

RELATED APPLICATIONS

The present application is a continuation of International Application No. PCT/CN2023/095810, filed on May 23, 2023, which claims priority to Chinese Patent Application No. 202210815436.0, filed on Jul. 8, 2022. The entire disclosures of the prior applications are incorporated herein by reference in their entirety.

FIELD OF THE TECHNOLOGY

This application relates to a signal processing technology, including to a method and apparatus for determining a superconducting impedance matched parametric amplifier, a superconducting impedance matched parametric amplifier, an electronic device, a computer program product, and a computer-readable storage medium.

BACKGROUND OF THE DISCLOSURE

The quantum bit (Qubit) on a superconducting chip is a carrier of quantum states and carries quantum information. Superconducting quantum computation has the advantage of a high running speed and is widely used by people. In the use of superconducting quantum chips, the superconducting quantum chip is in an environment of a very low temperature (<30 mK), and affected by noise, a signal output from the superconducting quantum chip is very weak, and it is generally necessary to add a multi-stage amplifier at the backward stage of the output end to improve the signal strength. Low-temperature amplifiers commercially available in related technologies generally operate at a 4 K temperature level, which brings about great thermal noise, while Josephson parametric amplifiers, which operate at the same temperature level as the superconducting quantum chip, have the excellent characteristics of a great gain and no introduction of additional noise, so the Josephson parametric amplifiers are important devices for performing superconducting quantum computation. Moreover, through an impedance transformer, a more gradual transition between the impedance of the environment and the impedance of the amplifier is achieved by using an adjunct circuit to realize coupling between the environment and a parametric oscillating circuit over a larger spectral range. However, due to the complex structure of the Josephson parametric amplifier and the impedance transformer, the combined impedance matched Josephson parametric amplifier has a low yield during processing, which increases the manufacturing cost of the quantum chip. Moreover, since the impedance matched Josephson parametric amplifier is sensitive to parameters, the required capacitance is large, and the insertion loss of the dielectric capacitance is large, and consequently performance enhancement of the impedance matched Josephson parametric amplifier is insufficient, and power consumption is high.

SUMMARY

Embodiments of this disclosure include a method and apparatus for determining a superconducting impedance matched parametric amplifier, a superconducting impedance matched parametric amplifier, an electronic device, a computer program product, and a computer-readable storage medium. The embodiment may be used to more effectively improve the performance of a conducting impedance matched parametric amplifier, reducing the loss of the conducting impedance matched parametric amplifier, and further improving the manufacturing yield of the conducting impedance matched parametric amplifier.

Technical solutions in the embodiments of this disclosure may be implemented as follows.

An embodiment of this disclosure provides a method for determining a superconducting impedance matched parametric amplifier. The method is executed by an electronic device, for example. In the method for determining the superconducting impedance matched parametric amplifier, a center wavelength parameter, a gain parameter, and a bandwidth parameter of the superconducting impedance matched parametric amplifier are determined based on an operating environment of a quantum chip. An impedance value of an impedance matching line of the superconducting impedance matched parametric amplifier and a capacitance value of the amplifier are determined based on the wavelength parameter, the gain parameter, and the bandwidth parameter as constraints. A line width dimension of a coplanar waveguide of the superconducting impedance matched parametric amplifier is calculated based on the impedance value of the impedance matching line. A stub dimension of the superconducting impedance matched parametric amplifier is calculated based on the impedance value of the impedance matching line and the capacitance value of the amplifier. Structural parameters of the superconducting impedance matched parametric amplifier are determined based on the line width dimension and the stub dimension.

An embodiment of this disclosure further provides an apparatus for determining a superconducting impedance matched parametric amplifier, the apparatus including processing circuitry. The processing circuitry is configured to determine a center wavelength parameter, a gain parameter, and a bandwidth parameter of the superconducting impedance matched parametric amplifier based on an operating environment of a quantum chip. The processing circuitry is configured to determine an impedance value of an impedance matching line of the superconducting impedance matched parametric amplifier and a capacitance value of the amplifier based on the wavelength parameter, the gain parameter, and the bandwidth parameter as constraints. The processing circuitry is configured to calculate a line width dimension of a coplanar waveguide of the superconducting impedance matched parametric amplifier based on the impedance value of the impedance matching line. The processing circuitry is configured to calculate a stub dimension of the superconducting impedance matched parametric amplifier based on the impedance value of the impedance matching line and the capacitance value of the amplifier. The processing circuitry is configured to determine structural parameters of the superconducting impedance matched parametric amplifier based on the line width dimension and the stub dimension.

An embodiment of this disclosure further provides a superconducting impedance matched parametric amplifier, the superconducting impedance matched parametric amplifier including:

an impedance transformer and a Josephson parametric amplifier, the impedance transformer and the Josephson parametric amplifier being integrated in a same quantum chip;

the impedance transformer including: a coplanar waveguide, the coplanar waveguide having a length of one-half wavelength of a center frequency; and the Josephson parametric amplifier including: a stub, the stub having a length matching a capacitance value of the superconducting impedance matched parametric amplifier.

An embodiment of this disclosure further provides an electronic device, the electronic device including:

a memory, configured to store a computer executable instruction; and a processor, configured to, when running the computer executable instruction stored in the memory, implement the method for determining a superconducting impedance matched parametric amplifier provided by the embodiment of this disclosure.

An embodiment of this disclosure provides a computer program product, including a computer executable instruction, the computer executable instruction, when executed by a processor, implementing the method for determining a superconducting impedance matched parametric amplifier provided by the embodiment of this disclosure.

An embodiment of this disclosure further provides a non-transitory computer-readable storage medium, storing instructions which when executed by at least one processor, implementing the method for determining a superconducting impedance matched parametric amplifier provided by the embodiment of this disclosure.

The embodiments of this disclosure have the following beneficial effects.

This disclosure determines, on the basis of parameters of an environment in which a quantum chip is used, a center wavelength parameter, a gain parameter and a bandwidth parameter of the superconducting impedance matched parametric amplifier; calculates, on the basis of the wavelength parameter, the gain parameter and the bandwidth parameter, an impedance value of an impedance matching line of the superconducting impedance matched parametric amplifier and a capacitance value of the amplifier; calculates, on the basis of the impedance value of the impedance matching line, a line width dimension of a coplanar waveguide of the superconducting impedance matched parametric amplifier; calculates, on the basis of the impedance value of the impedance matching line and the capacitance value of the amplifier, a stub dimension of the superconducting impedance matched parametric amplifier; and determines, on the basis of the line width dimension and the stub dimension, the structure of the superconducting impedance matched parametric amplifier. By way of the method for determining a superconducting impedance matched parametric amplifier provided by this disclosure, it is possible to better improve performances of a conducting impedance matched parametric amplifier, and reduce the loss of the conducting impedance matched parametric amplifier; and moreover, by way of the structure of the superconducting impedance matched parametric amplifier, during manufacturing of the conducting impedance matched parametric amplifier, the yield is higher, and the manufacturing cost is lowered, thereby facilitating popularizing superconducting quantum chips in a large scale.

BRIEF DESCRIPTION OF THE DRAWINGS

FIG. 4 is an example of a schematic structural diagram of a parametric amplifier in an embodiment of this disclosure;

FIG. 5B is an example of a schematic diagram of a process of a method for determining a superconducting impedance matched parametric amplifier in an embodiment of this disclosure;

FIG. 6 is a schematic structural diagram of a superconducting impedance matched parametric amplifier in an embodiment of this disclosure;

FIG. 7A is a schematic diagram of a capacitance used in a quantum parametric amplifier in the related technology;

FIG. 7B is a schematic diagram of the principle of a stub capacitance in an embodiment of this disclosure;

FIG. 7C is a cross-sectional diagram of a stub capacitance in an embodiment of this disclosure;

DESCRIPTION OF EMBODIMENTS

Figure 1:
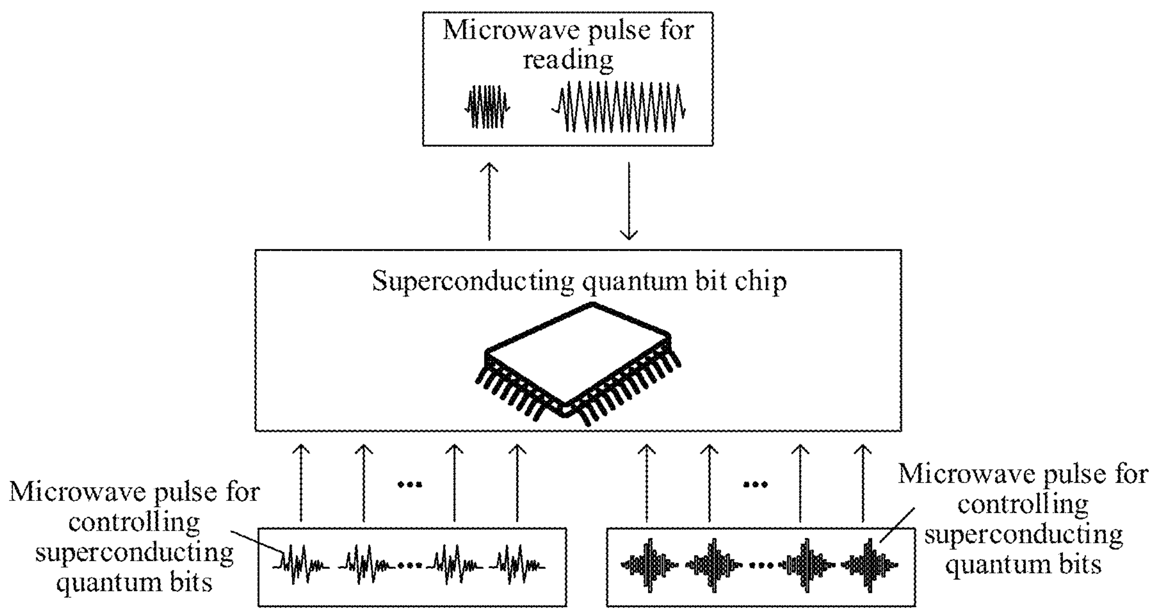
FIG. 1 is a schematic diagram of a usage scenario of a method for determining a superconducting impedance matched parametric amplifier provided by an embodiment of this disclosure.

To make the objectives, technical solutions, and advantages of this disclosure clearer, the following describes this disclosure in further detail with reference to the accompanying drawings. The described embodiments are not to be considered as a limitation to this disclosure. Other embodiments are within the scope of this disclosure.

In the following description, "some embodiments" are related and describe subsets of all possible embodiments, but it may be understood that "some embodiments" may be the same subset or different subsets of all the possible embodiments, and can be combined with each other without conflict.

Before the embodiments of this disclosure are further described in detail, a description example is made on nouns and terms in the embodiments of this disclosure, and the examples of the nouns and terms in the embodiments of this disclosure are applicable to the following explanations.

Layout: Also known as a circuit layout, it is, for example, a design drawing that describes how components in a circuit are laid out, placed and connected. It may be a planar geometric shape description of the physical situation of a real circuit.

Superconducting Quantum Bit: The superconducting quantum bit is, for example, a superconducting quantum circuit formed using Josephson junctions.

Superconducting Quantum Chip: The superconducting quantum chip is, for example, a central processing unit of a superconducting quantum computer. The quantum computer is a machine that utilizes the principles of quantum mechanics to perform calculation. On the basis of the superposition principle of quantum mechanics and quantum entanglement, the quantum computer has strong parallel processing capabilities and can solve some problems that are difficult to calculate by classical computers. The zero resistance characteristic of the superconducting quantum bit and the manufacturing process close to that of integrated circuits make a quantum computing system constructed using the superconducting quantum bit one of the most promising systems for achieving practical quantum computation in related technologies.

Coplanar Waveguide (CPW): It is, for example, a microwave planar transmission line superior in performance and convenient to process for transmitting microwave signals. In an example, a center conductor strip is made on one face of a dielectric substrate, and conductor planes are made on both sides immediately adjacent to the center conductor strip, thus constituting the CPW, also called a coplanar microstrip transmission line. The CPW propagates TEM waves with no cut-off frequency. As a center conductor and a conductor flat plate are located in the same plane, it is convenient to install components in parallel on the CPW, which can be made into a monolithic microwave integrated circuit with a transmission line and components on the same side. The superconducting quantum chip uses a lot of CPW technologies.

Etching/Wet Etching: In an example, photolithographic etching is an important part of a semiconductor process, being a graphical processing technology that performs, in accordance with layout design, selective corrosion and stripping on the surface of a semiconductor substrate. Etching is, for example, a process of selectively removing an unwanted material from the surface of a silicon wafer by a chemical or physical method, with the basic goal of correctly reproducing a mask pattern on a coated silicon wafer. Wet etching is, for example, an etching method in which an etching material is immersed in an etching solution for etching, with the advantages of good selectivity and reproducibility, high production efficiency, and a simple device at low cost.

Micro-Nano Fabrication: A micro-nano manufacturing technology includes, for example, the design, processing, assembly, integration and application technology of parts or systems composed of specific components, and the specific components may be sub-millimeter, micron and nanometer scale elements.

Components: As a general term of elements and devices, it refers to, for example, electronic parts and constituent elements in a circuit, such as resistors, capacitors, and inductors.

Amplifier: Includes, for example, a microwave power amplification device.

Josephson Parametric Amplifier (JPA): Composed of, for example, a capacitor and a pair of parallel Josephson junctions. The amplification process of the JPA is a process in which a nonlinear parametric process is used for amplifying input microwave signals, and the aforementioned nonlinear parametric process is the nonlinear parametric process of Josephson junctions under external flux modulation.

Input Signal: The input signal is, for example, a microwave signal which is inputted to the amplifier and to be amplified.

Pump Signal: The pump signal is, for example, provided to the amplifier through a pump port for energy conversion to amplify the microwave of the input signal.

Idler Signal: The idler signal is, for example, a non-demand microwave output automatically generated in a mixed wave nonlinear process.

Impedance Matching: Impedance transformation refers to impedance matching and is, for example, used for achieving matching between a microwave transmission line and microwave devices. An adjunct circuit is, for example, used for performing impedance matching, which allows for a more gradual transition between the impedance of an environment and the impedance of the amplifier to realize coupling between the environment and a parametric oscillating circuit over a larger spectral range.

Impedance Matched Josephson Parametric Amplifier (IMPA): The IMPA is obtained by, for example, integrating an impedance matching module in the JPA, and can achieve parametric amplification over a wider bandwidth range.

Stub Capacitance: A stub is, for example, a transmission line or a waveguide for connection, the stub can serve as a capacitance in a range of being equal to lower than a target frequency, known as a stub capacitance, and the stub is a waveguide structure using a connected open-circuit load and having a length less than a quarter wavelength of the target frequency.

Dielectric Capacitance: Between bottom metal and top metal of a chip, an insulating dielectric material, such as SiOx and AlOx, may be used, the bottom metal and the top metal of the chip may be spaced by tens of nanometers to hundreds of nanometers and a capacitance in a lumped form is formed, and the capacitance formed is an example of the dielectric capacitance.

Photolithography: Also known as optical lithography or ultraviolet photolithography, is, for example, a graphical precision machining process of parts, and is an important step in semiconductor manufacturing.

A frequency control signal processing method of quantum bits provided by an embodiment of this disclosure is described below. FIG. 1 is a schematic diagram of a usage scenario of the frequency control signal processing method of quantum bits provided by the embodiment of this disclosure. Referring to FIG. 1, a superconducting quantum computer is an electronic device that uses quantum logic to perform general purpose computation. Compared to related computers, the superconducting quantum computer can significantly improve the computation efficiency in solving some specific problems, thereby receiving widespread attention. Superconducting quantum chips can utilize relevant semiconductor process technologies to achieve large-scale integration. Moreover, superconducting quantum bits exhibit more superior performances than other physical systems in key indicators for performing quantum computation such as interaction control, selective operation, and error correction, being one of the most promising platforms for implementing superconducting quantum computers. Specifically, the superconducting quantum computers mainly include superconducting quantum chips and hardware systems used for chip control and measurement. The hardware systems mainly include signal generators in various microwave frequency bands and devices in various microwave frequency bands, including, but not limited to filters, amplifiers, isolators, etc., as well as dilution refrigerators equipped with microwave transmission lines. A key technology of the superconducting quantum computer lies in precise control and accurate measurement of quantum bit states on the superconducting quantum chip. The intrinsic energy of the superconducting quantum bits is in the microwave band of gigahertz (GHz), and achieving quantum gate operation and quantum state reading requires applying pulse microwave signals of a specific phase, amplitude, and duration to the superconducting quantum bit. Therefore, the superconducting quantum computer requires a large number of signal sources in the GHz microwave frequency band and signal modulation of arbitrary waveform at the GHz sampling rate. In addition, the superconducting quantum bit needs to be maintained at a temperature of milliKelvin to reduce thermal noise and maintain the coherent state thereof for a long time. Generally, the dilution refrigerator is selected and used for providing a low-temperature environment for the superconducting quantum chip. The dilution refrigerator needs to be equipped with a microwave transmission line to transmit microwave signals prepared at a room temperature to superconducting quantum bits in a low-temperature state. As shown in FIG. 1, a control subsystem is configured to control the quantum bit (Qubit) state to perform quantum computation, such as single-bit logic gate computation and two-bit logic gate computation. The superconducting quantum chip is configured to carry quantum computation information. A measurement subsystem is configured to read the final state of the Qubit and obtain the calculation result of quantum computation. The superconducting quantum chip is placed in a low-temperature environment, and the control subsystem generates pulse modulation signals according to the requirements of quantum computing operations, inputs a series of microwave pulse sequences into the superconducting quantum chip, and operates the quantum state of the Qubit. After all operations are completed, a measurement system outputs a measurement pulse signal to the superconducting quantum chip, and obtains the state information of the Qubit through the change of a returned signal, ultimately obtaining the calculation result. In a measurement process, low-temperature amplifiers commercially available in related technologies generally operate at a 4 K temperature level, which brings about great thermal noise, while Josephson parametric amplifiers, which operate at the same temperature level as the superconducting quantum chip, have the excellent characteristics of a great gain and no introduction of additional noise, so the Josephson parametric amplifiers are essential devices for performing superconducting quantum computation. Moreover, through an impedance transformer, a more gentle transition between the impedance of the environment and the impedance of the amplifier is achieved by using an adjunct circuit to realize coupling between the environment and a parametric oscillating circuit over a larger spectral range. However, due to the complex structure of the Josephson parametric amplifier and the impedance transformer, the combined impedance matched Josephson parametric amplifier has a low yield during processing, which increases the manufacturing cost of the quantum chip. Moreover, since the impedance matched Josephson parametric amplifier is sensitive to parameters, the required capacitance is large, and the insertion loss of the dielectric capacitance is large, and consequently performance enhancement of the impedance matched Josephson parametric amplifier is insufficient, and power consumption is too high. Therefore, it is necessary to provide a superconducting impedance matched parametric amplifier of a novel structure to ensure high-yield production of superconducting impedance matched parametric amplifiers with large bandwidth and low insertion loss close to quantum limit noise, in order to meet the large-scale use requirement of quantum chips.

Figure 2:
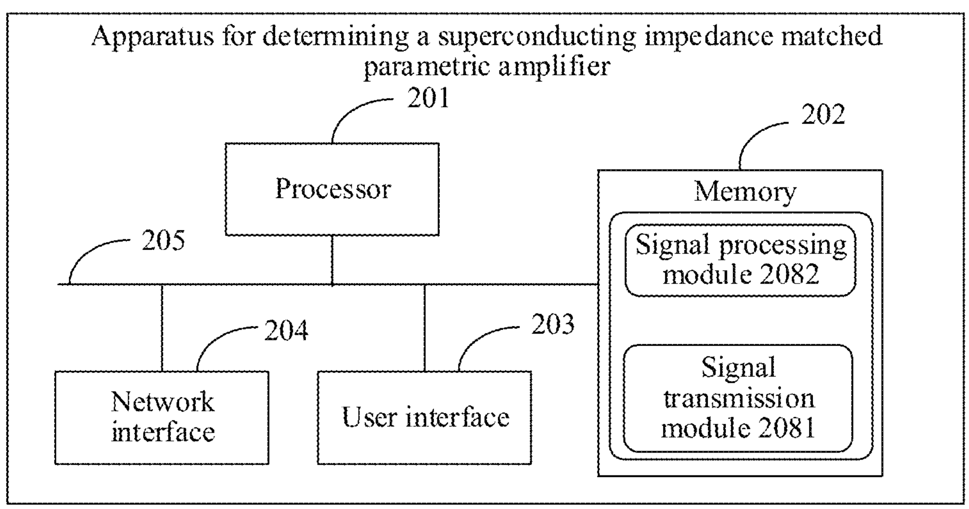
FIG. 2 is a schematic structural diagram of a composition of an apparatus for determining a superconducting impedance matched parametric amplifier provided by an embodiment of this disclosure.

The structure of an apparatus for determining a superconducting impedance matched parametric amplifier in an embodiment of this disclosure is described in more detail below. The apparatus for determining a superconducting impedance matched parametric amplifier can be implemented in various forms, such as a superconducting quantum chip with a processing function of the apparatus for determining a superconducting impedance matched parametric amplifier, or an integrated chip with the processing function of the apparatus for determining a superconducting impedance matched parametric amplifier, such as, a superconducting quantum chip 200 in FIG. 1. FIG. 2 is a schematic structural diagram of a composition of the apparatus for determining a superconducting impedance matched parametric amplifier provided by the embodiment of this disclosure. It can be understood that FIG. 2 only shows an exemplary structure of the apparatus for determining a superconducting impedance matched parametric amplifier, rather than the entire structure. As needed, some or all of the structures shown in FIG. 2 can be implemented.

The apparatus for determining a superconducting impedance matched parametric amplifier provided by the embodiment of this disclosure includes: at least one processor 201, a memory 202, a user interface 203, and at least one network interface 204. Various components in the apparatus for determining a superconducting impedance matched parametric amplifier are coupled together by way of a bus system 205. It may be understood that, the bus system 205 is configured to implement connection and communication between the components. In addition to a data bus, the bus system 205 further includes a power bus, a control bus, and a state signal bus. But, for ease of clear description, all types of buses in FIG. 2 are marked as the bus system 205.

The user interface 203 may include a display, a keyboard, a mouse, a track ball, a click wheel, a key, a button, a touch panel, a touchscreen, or the like.

It may be understood that, the memory 202 may be a volatile memory or a non-volatile memory, or may include both a volatile memory and a non-volatile memory. The memory 202 in the embodiment of this disclosure can store data to support operations in a superconducting quantum chip in a terminal. Examples of the data include: any computer program used for being operated on the superconducting quantum chip of the terminal, such as an operating system and an application program. The operating system includes various system programs, such as, a frame layer, a core library layer, and a drive layer, configured to implement various basic services and process tasks based on hardware. The application programs may include various application programs.

In some embodiments, the apparatus for determining a superconducting impedance matched parametric amplifier provided by the embodiment of this disclosure can be implemented by combining software and hardware. As an example, the apparatus for determining a superconducting impedance matched parametric amplifier provided by the embodiment of this disclosure can use a processor in the form of a hardware decoding processor, which is programmed to execute the method for determining a superconducting impedance matched parametric amplifier provided by the embodiment of this disclosure. For example, the processor in the form of the hardware decoding processor can use processing circuitry, such as one or more application specific integrated circuits (ASIC), a DSP, a programmable logic device (PLD), a complex programmable logic device (CPLD), a field-programmable gate array (FPGA), or other electronic elements.

As an example of the apparatus for determining a superconducting impedance matched parametric amplifier provided by the embodiment of this disclosure, which is implemented by combining software and hardware, the apparatus for determining a superconducting impedance matched parametric amplifier provided by the embodiment of this disclosure can be directly reflected as a combination of software modules executed by processing circuitry, such as the processor 201. The software module may be located in a storage medium, and the storage medium is located in the memory 202. The processor 201 reads an executable instruction included in the software module of the memory 202, and combines same with necessary hardware (such as including the processor 201 and other components connected to the bus 205) to complete the method for determining a superconducting impedance matched parametric amplifier provided by the embodiment of this disclosure.

As an example, the processor 201 may be a superconducting electronic chip with signal processing capabilities, including processing circuitry, such as such as a general-purpose processor, a digital signal processor (DSP), or other programmable logic devices, a discrete gate or a transistor logic device, and a discrete hardware component. The general-purpose processor may be a microprocessor or any related processor or the like.

As an example of the apparatus for determining a superconducting impedance matched parametric amplifier provided by the embodiment of this disclosure, which is implemented using hardware, the apparatus provided by the embodiment of this disclosure can be directly executed and completed using the processor 201 in the form of a hardware decoding processor, for example, processing circuitry including one or more application specific integrated circuits (ASIC), a DSP, a programmable logic device (PLD), a complex programmable logic device (CPLD), a field-programmable gate array (FPGA), or other electronic elements to implement the method for determining a superconducting impedance matched parametric amplifier provided by the embodiment of this disclosure.

The memory 202 in the embodiment of this disclosure is configured to store various types of data to support operations of the apparatus for determining a superconducting impedance matched parametric amplifier. Examples of the data include: any executable instruction, used for being operated on the apparatus for determining a superconducting impedance matched parametric amplifier, such as an executable instruction, and a program for implementing the method for determining a superconducting impedance matched parametric amplifier in the embodiment of this disclosure can be included in the executable instruction.

In some embodiments, the apparatus for determining a superconducting impedance matched parametric amplifier provided by the embodiment of this disclosure can be implemented using software. FIG. 2 shows the apparatus for determining a superconducting impedance matched parametric amplifier stored in the memory 202, which can be software in the form of programs and plugins, and includes a series of modules as examples of programs stored in the memory 202, the apparatus for determining a superconducting impedance matched parametric amplifier may be included, and the apparatus for determining a superconducting impedance matched parametric amplifier includes the following software modules: a signal transmission module 2081 and a simulation design module 2082, where the signal transmission module 2081 and the simulation design module 2082 can form simulation design software for microwave generation methods to calculate structural parameters of a superconducting impedance matched parametric amplifier. When the software module in the apparatus for determining a superconducting impedance matched parametric amplifier is read into a random access memory (RAM) by the processor 201 and executed, the method for determining a superconducting impedance matched parametric amplifier provided by the embodiment of this disclosure will be implemented. The functions of each software module in the apparatus for determining a superconducting impedance matched parametric amplifier include as follows.

The signal transmission module 2081 is configured to determine, on the basis of parameters of an environment in which a quantum chip is used, a center wavelength parameter, a gain parameter and a bandwidth parameter of the superconducting impedance matched parametric amplifier.

The simulation design module 2082 is configured to determine, with the wavelength parameter, the gain parameter and the bandwidth parameter as constraints, an impedance value of an impedance matching line of the superconducting impedance matched parametric amplifier and a capacitance value of the amplifier.

The simulation design module 2082 is further configured to calculate, on the basis of the impedance value of the impedance matching line, a line width dimension of a coplanar waveguide of the superconducting impedance matched parametric amplifier.

The simulation design module 2082 is further configured to calculate, on the basis of the impedance value of the impedance matching line and the capacitance value of the amplifier, a stub dimension of the superconducting impedance matched parametric amplifier.

The simulation design module 2082 is further configured to determine, on the basis of the line width dimension and the stub dimension, structural parameters of the superconducting impedance matched parametric amplifier.

This disclosure further provides a computer program product, where the computer program product includes a computer executable instruction, and the computer executable instruction is stored in a computer-readable storage medium. A processor of an electronic device reads the computer instruction from a computer-readable storage medium, and the processor executes the computer instruction such that the electronic device executes different embodiments and a combination of embodiments provided in various implementations of the above method for determining a superconducting impedance matched parametric amplifier.

Figure 3:
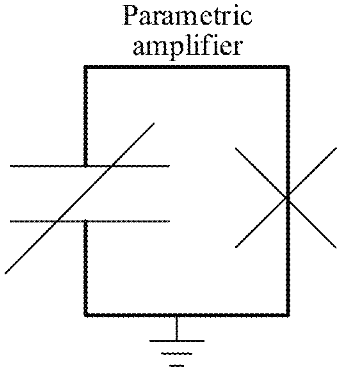
FIG. 3 is an example of a schematic structural diagram of a parametric amplifier in an embodiment of this disclosure.

Before introducing the method for determining a superconducting impedance matched parametric amplifier proposed in this disclosure, a superconducting impedance matched parametric amplifier in the relevant technology is first introduced. Specifically, referring to FIG. 3, FIG. 3 is an example of a schematic structural diagram of a parametric amplifier in an embodiment of this disclosure, a superconducting Josephson junction loop in the relevant technology is used as a nonlinear element and is connected in parallel with a dielectric capacitance to form a superconducting parametric resonance circuit. In order to increase a bandwidth, an impedance matching technology is used in the related technology, specifically an impedance matched structure composed of a waveguide with a center frequency at the center of an amplified bandwidth is used, and the waveguide is a structure in which a quarter wavelength waveguide and a half wavelength waveguide are connected in series. Near the Josephson junction loop, amplification is achieved by applying drive and DC bias of approximately twice the amplification center frequency through a coplanar waveguide. As shown in FIG. 3, the parametric amplifier is generally driven by a resonance circuit (usually an inductor-capacitor parallel resonance circuit), a tunable nonlinear element (a semiconductors typically uses a variable capacitor, and a superconducting circuit typically uses an adjustable inductor made of Josephson junctions), and a pump with an externally applied resonant frequency acting twice.

Referring to FIG. 4, FIG. 4 is an optical schematic structural diagram of a parametric amplifier in the embodiment of this disclosure. A superconducting Josephson junction, as a typical superconducting nonlinear device, plays a core role in the superconducting parametric amplifier. A flux quantization effect in a Josephson junction loop makes the loop behave like an inductor that can be modulated by an externally applied flux under a small-current condition. A small current is an abbreviation of a small current grounding line selection apparatus in the industry, and is suitable for single-phase grounding line selection in 3 KV to 66 KV neutral point ungrounded systems or neutral point grounded systems through resistance and arc suppression coils. Moreover, due to the characteristic of superconductivity, the resistance loss thereof can also be ignored under an ideal condition. When a flux pump of approximately twice the input signal is applied to the superconducting loop, the input signal can be effectively amplified. The superconducting parametric amplifier is essentially a nonlinear resonator, in which a superconducting phase oscillates. A superconducting phenomenon is a typical macroscopic quantum phenomenon, in which a large number of conducting electrons are combined through certain mechanisms to form Cooper pairs and condense together, forming a quantum state in a collective mode. Superconducting condensation opens up energy gaps in the energy band, the energy gaps correspond to energy scales, and the energy scales correspond to interactions. Superconducting condensation can eliminate all corresponding interactions below the energy gap, providing excellent protection for the system and achieving desirable effects for many applications: zero resistance and complete diamagnetism. As a macroscopic quantum effect, although the number of particles involved in the superconducting phenomenon is at the macroscopic level, the degree of freedom exhibited is only phase. Usually, the noise in a circuit comes from uncontrollable degrees of freedom. In the superconducting parametric amplifier, only the degree of freedom is involved, and a large number of other related degrees of freedom are frozen due to the protection of the superconducting energy gap, resulting in extremely low natural noise. People usually mention the quantum limit noise of the superconducting parametric amplifier. The existence of nonlinearity makes the oscillation frequency of the amplifier related to the amplitude size. For the JPA, the larger the amplitude, the lower the resonance frequency. When the amplitude approaches a critical value, even extremely weak disturbance will cause significant changes in the system response characteristics. The JPA needs to first use a high-power pump signal to drive the system to approach to the critical state, then the input signal is equivalent to the disturbance, and the change in response characteristics causes an output change. In the process, there is a certain phase relationship between the disturbance (signal) and the pump. When the signal frequency is consistent with the pump frequency, significant amplification can be achieved only when the signal frequency and the pump frequency are in the same phase. However, when the phase difference is 90 degrees, the output actually shrinks, which, in theory, perfectly satisfies the condition of “exceeding the quantum limit” mentioned above. There are strict conditions for exceeding the quantum limit, which can occur only when the signal frequency is consistent with the pump frequency. If there is a deviation between the signal frequency and the pump frequency, according to the trigonometric relationship, signal light can always be decomposed into two components, half of the components are in same phase with pump light, and half of the components are 90 degrees different from the pump light. Therefore, the overall gain is independent of an initial phase, that is, the minimum value of additional noise is half of a photon.

However, the type of amplifier also has the problem of narrow bandwidth frequency. Especially in the case of multiplexing reading in superconducting quantum computation, bandwidth requirements are proposed for the bandwidth of the superconducting parametric amplifier. To address the aforementioned technical problems, impedance transformers are used in related technologies. By using the impedance transformer to reduce the impedance difference between the superconducting parametric amplifier and an environment of 50 Ohms, coupling between the superconducting parametric amplifier and the environment of 50 Ohms becomes smoother. By reducing the impedance difference between the environment and the amplified resonance circuit, a narrow band of around 10 megahertz (MHz) can be extended to the required range of several hundred MHz. But in the process, it is necessary to control the intensity of impedance matching well. If the bandwidth is too large, it may lead to an overall decrease in gain. The ultimate goal is to achieve greater bandwidth by sacrificing some gain.

The superconducting impedance matched parametric amplifier schemes provided in relevant technologies all use a structure in which a quarter wavelength waveguide and a half wavelength waveguide are connected in series. The quarter wavelength waveguide plays an impedance matching role. The half wavelength waveguide introduces an auxiliary mode of resonance, which can equivalently widen the bandwidth by introducing a second resonance point. However, the applicant found that the quarter wavelength waveguide in the relevant technology cannot effectively improve the overall performance of the amplifier, and even increases the level of sensitivity of a circuit of the entire superconducting impedance matched parametric amplifier to fluctuations of processing parameters. Moreover, since the impedance transformer and the parametric amplifier used in superconducting impedance matched parametric amplifier are not of the same planar structure, there is a defect of a low yield in the production process of the impedance matched parametric amplifier, which increases the manufacturing cost of the impedance matched parametric amplifier.

Figure 5A:
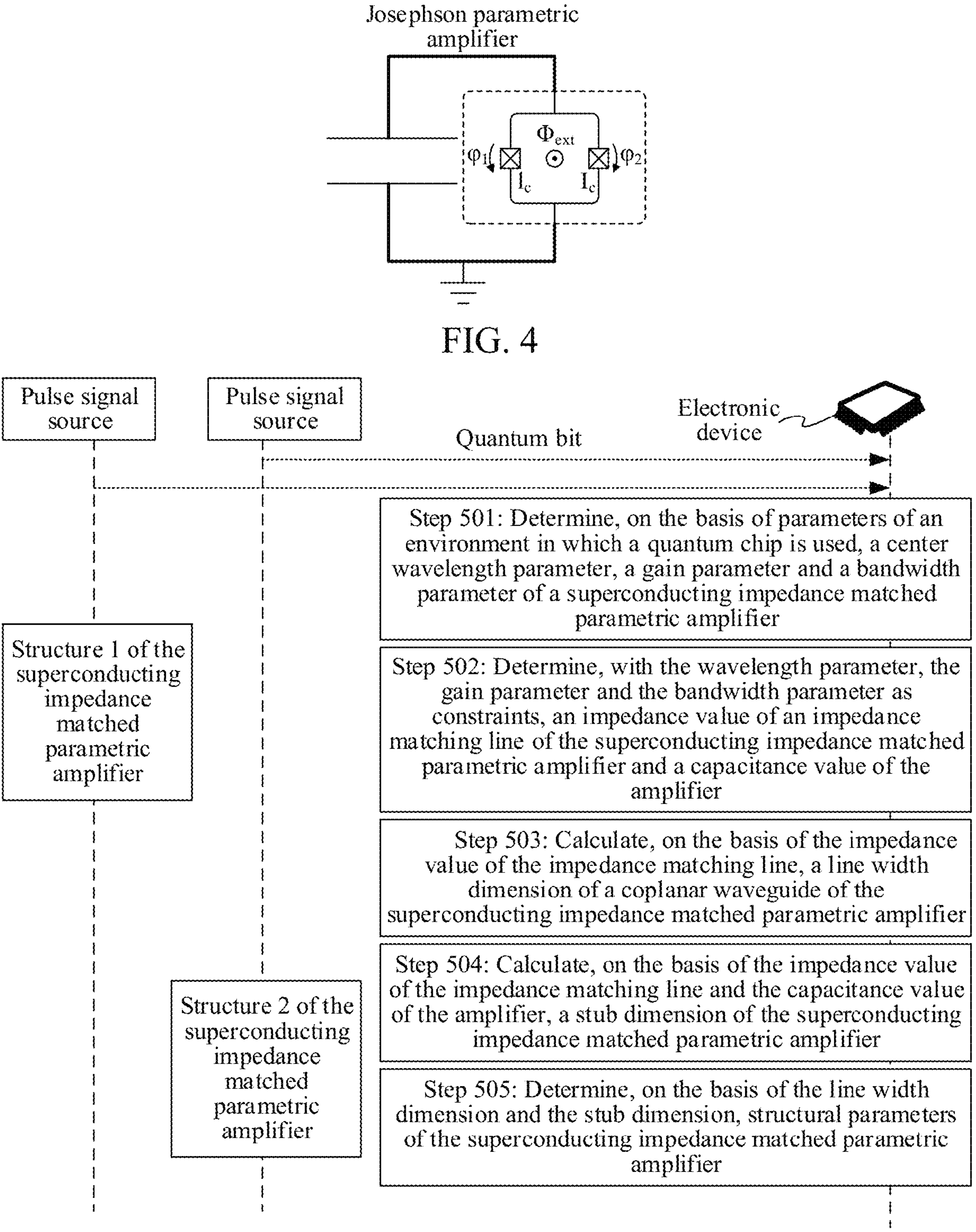
FIG. 5A is an example of a schematic diagram of a process of a method for determining a superconducting impedance matched parametric amplifier in an embodiment of this disclosure.

In order to overcome the above defects, an embodiment of this disclosure provides a superconducting impedance matched parametric amplifier that can improve performances. Referring to FIG. 5A. FIG. 5A is an example of a schematic diagram of a process of a method for determining a superconducting impedance matched parametric amplifier in the embodiment of this disclosure, which can be executed by the aforementioned electronic device, specifically including step 501 to step 505 as follows.

Step 501: Determine, on the basis of parameters of an environment in which a quantum chip is used, a center wavelength parameter, a gain parameter and a bandwidth parameter of the superconducting impedance matched parametric amplifier.

As an example, parameters of an environment in which a superconducting quantum chip is used include a maximum value of a read frequency, a minimum value of the read frequency, and a bandwidth range of the read frequency. The bandwidth range of the read frequency is obtained by reading the bandwidth range of a cavity from the superconducting quantum chip, the maximum value of the read frequency is the maximum value among multiple frequencies obtained after the frequency of the cavity is read multiple times in the superconducting quantum chip, and the minimum frequency of the read frequency is the smallest value among the multiple frequencies obtained after the frequency of the cavity is read multiple times in the superconducting quantum chip. The center wavelength parameter, the bandwidth parameter and the parameters of the usage environment satisfy the following matching conditions. The bandwidth parameter is not larger than the bandwidth range of the read frequency. The center wavelength parameter is a ratio of the speed of light to a center frequency parameter. A sum result of the center frequency parameter and 0.5 times the bandwidth parameter is not smaller than the maximum frequency. A subtraction result between the center frequency parameter and 0.5 times the bandwidth parameter is not larger than the minimum frequency.

The parameters of the environment in which the superconducting quantum chip is used include the bandwidth range of a frequency, and the bandwidth range of the frequency (bandwidth parameter) is obtained by reading the bandwidth range of the cavity from the superconducting quantum chip. For example, the bandwidth range is within the bandwidth of 300-500 MHZ, and 1 to 7 frequencies are uniformly read. Any bandwidth within the above bandwidth range can be used as the bandwidth parameter of the superconducting impedance matched parametric amplifier. As illustrated by the example that the bandwidth range is 500 MHz, in determining the center frequency f of the superconducting impedance matched parametric amplifier, when the bandwidth range is w, it is necessary to ensure that the 7 read frequencies are in a frequency interval from f−0.5 w to f+0.5 w, i.e., as long as the value of the center frequency f satisfies the requirement that the 7 read frequencies are in the interval from f−250 MHz to f+250 MHz, then the center wavelength parameter can be determined on the basis of the center frequency f. The center wavelength parameter is equal to the ratio of the speed of light to the center frequency.

As an example, the parameters of the environment in which the quantum chip is used also include the number of frequencies read simultaneously when the frequency of the cavity is read from the superconducting quantum chip, and the gain parameter and the parameters of the usage environment satisfy the following matching conditions: the gain parameter and the number of frequencies read simultaneously satisfy a negatively correlated calculation relationship.

According to the number of frequencies needing to be simultaneously read, a required saturation power is determined, specifically, the power required to read a quantum bit is P, and then an N*P microwave power is required for simultaneously reading N bits, where the microwave power herein is the saturation power. Due to the output saturation phenomenon of the parametric amplifier, the higher the microwave power, the smaller the gain that can be obtained, i.e., the gain parameter is negatively correlated with the microwave power. Usually the saturation power is at −115 dBm, the larger the number of amplifier frequencies needing to be read simultaneously, the higher the saturation power required, then, the critical current of a Josephson junction during amplification circuit resonance can be increased to a certain extent, and the capacitance of the resonance circuit also needs to be increased to the same extent, thereby reducing the gain parameter.

Step 502: Determine, with the wavelength parameter, the gain parameter and the bandwidth parameter as constraints, an impedance value of an impedance matching line of the superconducting impedance matched parametric amplifier and a capacitance value of the amplifier.

As an example, the impedance value of the impedance matching line is equal to the square root of the product of the characteristic impedance of the Josephson parametric amplifier and the impedance of the environment, where the impedance of the environment is 50 Ohms. The characteristic impedance value of the Josephson parametric amplifier is the square root of a ratio of the inductance to the capacitance of the Josephson parametric amplifier.

As an example, the amplifier in the "capacitance value of the amplifier" is actually a Josephson parametric amplifier, and the Josephson parametric amplifier herein is a composition structure of the superconducting impedance matched parametric amplifier. The capacitance value of the Josephson parametric amplifier is the capacitance value of the superconducting impedance matched parametric amplifier, and the capacitance value of the Josephson parametric amplifier is the reciprocal of the product of the square of the center frequency and the inductance of the Josephson parametric amplifier.

After calculating the impedance value of the impedance matching line and the capacitance value of the amplifier on the basis of the above example, it is necessary to test whether the wavelength parameter, the gain parameter and the bandwidth parameter calculated in step 501 can be realized by microwave simulation software, i.e., it is equivalent to using the wavelength parameter, the gain parameter and the bandwidth parameter calculated in step 501 as conditional constraints to perform fine adjustment on the impedance value of the impedance matching line and the capacitance value of the amplifier. The specific implementation is to input the impedance value of the impedance matching line and the capacitance value of the amplifier into the simulation software to test whether the wavelength parameter, the gain parameter and the bandwidth parameter calculated in step 501 can be outputted. If the values of the parameters can be outputted, there is no need to perform fine adjustment, otherwise, the impedance value of the impedance matching line and the capacitance value of the amplifier can be adjusted and then inputted into the simulation software to test whether the wavelength parameter, the gain parameter and the bandwidth parameter calculated in step 501 can be outputted, and adjustment is performed until the wavelength parameter, the gain parameter and the bandwidth parameters calculated in step 501 can be outputted.

Step 503: Calculate, on the basis of the impedance value of the impedance matching line, a line width dimension of a coplanar waveguide of the superconducting impedance matched parametric amplifier.

As an example, the line width dimension includes a cross-section dimension corresponding to the impedance matching line and a waveguide length. The line width dimension is found by microwave simulation software and is not theoretically calculated. First, a cross-sectional dimension corresponding to the impedance value of the impedance matching line is determined by simulation. Specifically, by inputting any one of cross-sectional dimensions into the simulation software, the simulation software outputs an impedance value corresponding to a hypothetical cross-sectional dimension, and then adjusts the input cross-sectional dimension several times until the impedance value output by the simulation software is equal to the impedance value calculated in step 502, and the cross-section dimension inputted at the time of equality is used as the cross-section dimension included in the above-mentioned line width dimension. After the cross-sectional dimension is determined, the cross-sectional dimension and any one waveguide length are inputted into the simulation software, the simulation software outputs the resonant frequency of the coplanar waveguide, the cross-sectional dimension is kept unchanged and the waveguide length is adjusted several times until the resonant frequency outputted by the simulation software is equal to the center frequency parameter calculated in step 501.

Through processing of step 503, the line width dimension of the coplanar waveguide is a distance at one half of the wavelength of a target center frequency, and due to the reduction of the line width dimension of the coplanar waveguide, the requirement for the capacitance value of the amplifier is lowered. It is possible to lower 3 pF to 1 pF in the related technology, making it become a reality to realize a low-loss capacitance using a planar structure. Moreover, the amplification performance same as that in the related technology can be obtained by way of the line width dimension of the coplanar waveguide at the distance of a half wavelength waveguide. Moreover, the tolerance level of the overall performance of the amplifier to deviation of the processing parameter is improved, which effectively improves the processing yield of the superconducting impedance matched parametric amplifier and reduces the production cost.

In some embodiments, when the characteristic impedance of the desired impedance matching portion of the superconducting impedance matched parametric amplifier changes, the change can be realized by adjusting the cross-sectional dimension of the coplanar waveguide. With that the impedance value of the impedance matching line decreases as an example, when the impedance value of the impedance matching line decreases, a shape of the coplanar waveguide of the superconducting impedance matched parametric amplifier is adjusted to be a curved state, and the microwave resonant frequency of the waveguide does not vary significantly according to whether the waveguide is a straight waveguide or a curved waveguide, so the above technical effect can also be realized. Moreover, the coplanar waveguide in the curved state can be adapted to different mounting requirements for the quantum chip in more usage scenarios.

Step 504: Calculate, on the basis of the impedance value of the impedance matching line and the capacitance value of the amplifier, a stub dimension of the superconducting impedance matched parametric amplifier.

As an example, the number of stubs is preset, the stubs are configured to make the capacitance of the amplifier, and the capacitance value is calculated in step 502, for example, the number of the stubs is 6, and in the embodiment of this disclosure, the 6 stubs are used and connected in parallel to realize the capacitance value calculated in step 502, so that the capacitance of each stub can be determined, i.e., the capacitance of each stub is obtained by dividing the capacitance value of step 502 by the number of the stubs. By setting ports of the stubs and performing microwave simulation by the simulation software, the stub dimension required for realizing the capacitance of the stub is obtained, where the stub dimension includes the length of the stub and the width of a gap between the stub and the ground.

Referring to FIG. 5B, FIG. 5B is an example of a schematic diagram of a process of a method for determining a superconducting impedance matched parametric amplifier in an embodiment of this disclosure, in the process of executing step 501 to step 504, by way of the simulation design software composed of a signal transmission module and a simulation design module in a set of preceding embodiments, the structural parameters of the superconducting impedance matched parametric amplifier are determined with a microwave network synthesis method, that is, a method for searching for desired circuit element parameters on the basis of a desired circuit performance. Analogous to the idea of synthesizing a large bandwidth band rejection filter, in order to synthesize gain of the bandwidth, parameters, obtained at the time of attenuation, of the same center, bandwidth and negative gain are assigned to an amplifier circuit, and further, an internal positive resistance connected in parallel with the resonance circuit is transformed into a negative resistance of the same absolute value. The structure of the negative resistance connected in parallel with the inductance in an obtained new circuit will be realized by a Josephson loop modulated by the parameters. In addition to the capacitance, inductance, and negative resistance required for the resonant amplification circuit, the method will also give the basic parameters of an impedance transformation part, i.e., the impedance value of one half of the impedance matching line.

Step 505: Generate, on the basis of the line width dimension and the stub dimension, structural parameters of the superconducting impedance matched parametric amplifier.

As an example, the line width dimension is used as the structural parameter of the superconducting impedance matched parametric amplifier, and the stub dimension is used as the structural parameter of the superconducting impedance matched parametric amplifier. Herein, the coplanar waveguide and the stub are both important structures of the superconducting impedance matched parametric amplifier, and after the line width dimension and the stub dimension are known, by way of the simulation software, a line is drawn in accordance with the line width dimension and the stub dimension, so that the structure of the entire superconducting impedance matched parametric amplifier is obtained. The structure obtained herein can have a variety as long as requirements for the line width dimension and the stub dimension can be met.

After the structural parameters of the superconducting impedance matched parametric amplifier are determined, the efficacy of the superconducting impedance matched parametric amplifier can continue to be detected and adjusted on the basis of the line width dimension and the stub dimension. Referring to FIG. 6, FIG. 6 is a schematic structural diagram of a superconducting impedance matched parametric amplifier in an embodiment of this disclosure, where one end is a microwave interface for input and output. Usually, after the input and output of a circulator are separated from one port, the input and output are connected to a section of coplanar waveguide having one half of the wavelength at the center frequency. The section of waveguide is fabricated using a coplanar waveguide structure on the substrate chip same as the parametric amplifier. Finally, the coplanar waveguide is then connected in series with the superconducting parametric amplifier. In the vicinity of the Josephson junction of the parametric amplifier, a coplanar waveguide line can be configured to apply a pump frequency of approximately two times the center of the amplification frequency to drive the entire amplifier to operate. As a result, in this disclosure, by using a stub structure, the Josephson parametric amplifier makes it possible to realize the capacitance of the amplifier using a planar structure, thereby reducing the loss.

In some embodiments, a room temperature resistance value of the Josephson junction of the superconducting impedance matched parametric amplifier can be calculated on the basis of the capacitance value of the amplifier and the center frequency of the superconducting impedance matched parametric amplifier to achieve the effect of measuring the quantum bit state, where the room temperature resistance value is used for measuring the quantum bit state. On the basis of parameters of different environments in which the superconducting impedance matched parametric amplifier is used, the center frequency of the superconducting impedance matched parametric amplifier can be determined to meet the corresponding design use requirements.

As an example, the inductance value of the parametric amplifier is equal to a value obtained by dividing the square of the center frequency by the capacitance value of the parametric amplifier, and the room temperature resistance of the Josephson junction can be calculated according to equation (1):

$$R = \frac{\pi * \Delta}{2 * e * \phi 0} L_j; \tag{1}$$

where Δ is a superconducting energy gap of a superconducting material used, e is a base charge, ϕ0 is a reduced quantum flux, $L_j$ is the inductance value of the parametric amplifier, and R is the room temperature resistance of the Josephson junction.

Referring to FIG. 7A to FIG. 7C, where FIG. 7A is a schematic diagram of a capacitance used in a quantum parametric amplifier in the related technology, FIG. 7B is a schematic diagram of the principle of a stub capacitance in an embodiment of this disclosure, and FIG. 7C is a cross-sectional diagram of a stub capacitance in an embodiment of this disclosure.

When the structural parameters of the superconducting impedance matched parametric amplifier are determined, in addition to stable and reliable large bandwidth amplification, attention is also to be paid to the insertion loss of the amplifier itself, comparing the output with the input, in a case that an amplification pump is not provided, due to the loss introduced by the amplifier itself, the insertion loss in the related technology mainly comes from the capacitance structure forming the parametric amplifier.

As shown in FIG. 7A which shows the capacitance used in the quantum parametric amplifier in the related technology, the capacitance has the advantage of a high capacitance density, so that the required capacitance can be made in a very small area, thereby reducing a parasitic inductance caused by a geometric structure. However, due to the use of a lossy dielectric material, the type of capacitor has the disadvantage of a high insertion loss.

Referring to the stub capacitance which is shown in FIG. 7B, the dielectric of the stub capacitance is a vacuum and low loss substrate material. By avoiding the use of an amorphous state dielectric material, the planar design can reduce the insertion loss of the amplifier. Referring to FIG. 7C, a short coplanar waveguide with an open-circuit load can be equivalent to a capacitance to ground. Since the capacitance provided by a single stub is limited, increasing the length will introduce too much parasitic inductance, affecting the gain of the amplifier. In practical design, multiple similar stub capacitance structures are connected in parallel and connected in parallel with the Josephson junction loop to form a parametric amplification circuit. In practical applications, it is also necessary to add a parasitic mode caused by the stub capacitance of a large jet bridge reduction at the root of the stub as shown in FIG. 7C.

Continuing to refer to the schematic structural diagram of the superconducting impedance matched parametric amplifier shown in FIG. 6, the structural improvement of the conducting impedance matched parametric amplifier provided by this disclosure is described. The impedance transformer and the Josephson parametric amplifier are integrated into the same quantum chip. The impedance transformer includes: a coplanar waveguide, the coplanar waveguide having a length of one-half wavelength of a center frequency of the Josephson parametric amplifier. The Josephson parametric amplifier includes: a stub, the stub having a length matching a capacitance value of the superconducting impedance matched parametric amplifier. Since the length of the stub is calculated on the basis of the capacitance value of the superconducting impedance matched parametric amplifier, the length of the stub matches the capacitance value of the superconducting impedance matched parametric amplifier. The calculation method here can refer to the implementation of step 504.

In some embodiments, when multiple parallel open-circuit coplanar waveguide structures are configured to achieve the capacitance, coplanar waveguides with smaller gaps and thicker centers can be used for reducing the parasitic series inductance. Specifically, the impedance value of the stub capacitance of the selected geometric dimension within a certain range near the desired center frequency can be first calculated. Then, a lumped circuit in which the capacitor and the inductor are connected in series is configured to fit the above impedance and frequency relationship curve to obtain the capacitance value and the parasitic inductance value. It ensures that the total capacitance value of several parallel stub capacitances meets a design value.

In some embodiments, when manufacturing the superconducting impedance matched parametric amplifier, a section of one-half wavelength coplanar waveguide line can be connected in series between the parametric amplification circuit and a solder pad used for connecting to the environment. As the impedance transformer and the Josephson parametric amplifier are integrated on the same chip, the uncertainty introduced by manual processing in previous discrete designs is reduced, and the manufacturing yield of the superconducting impedance matched parametric amplifier is improved.

In some embodiments, when manufacturing the superconducting impedance matched parametric amplifier, lead wires are bonded to a core wire of a microwave connector fixed externally on a sample box. The length of the lead wire required for performing connection and the number of parallel connections are ensured, thereby ensuring that the structure where the lead wires are combined with the solder pad has a characteristic impedance that is close to the impedance of the environment. This can reduce unnecessary reflections with the environment and improve the impedance environment of the amplifier. Moreover, bulk metal of the sample box will also be connected to a large piece of metal film representing the ground on the chip using a large number of lead wires, ensuring good grounding property and achieving the durability of the superconducting impedance matched parametric amplifier.

Figure 8:
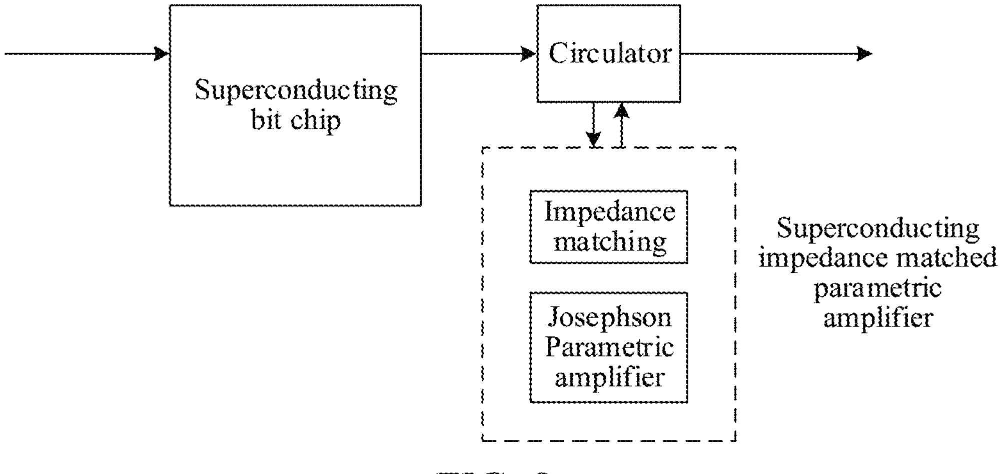
FIG. 8 is a schematic diagram of use of a superconducting impedance matched parametric amplifier in an embodiment of this disclosure.

Referring to FIG. 8, FIG. 8 is a schematic diagram of use of a superconducting impedance matched parametric amplifier in an embodiment of this disclosure. A target port for accessing a pump signal is configured for the superconducting impedance matched parametric amplifier, and the target port is configured to determine an operating point of the superconducting impedance matched parametric amplifier. It is possible to determine a center frequency of the superconducting impedance matched parametric amplifier through the target port (the center frequency is determined on the basis of the intensity of a microwave signal reflected by the port, that is, the frequency corresponding to the minimum reflection intensity is used as the center frequency). Specifically, in conjunction with reading use of quantum bit chips, signals read by the bit chip are introduced into the superconducting impedance matched parametric amplifier described in the embodiment of this disclosure by way of a circulator. The amplified reflection signal is separated from the input signal by the circulator. After undergoing secondary and tertiary amplification by low-temperature and room temperature amplifiers, the state of quantum bits is analyzed and determined by room temperature electronic devices. In addition to an input and output port, the superconducting impedance matched parametric amplifier also has the port for accessing the pump signal. Usually, it is necessary to mix DC bias and microwave drive by a polarizer and then connect same to the port. The port here refers to a pump input port required for operation of the amplifier, not an operating port of the input signal. By scanning appropriate DC bias, the operating point of the superconducting impedance matched parametric amplifier is determined. By scanning the DC bias, the center frequency of the amplifier can be changed to align same with the microwave frequency that needs to be amplified to determine the operating point. By applying a driving microwave, the superconducting impedance matched parametric amplifier achieves an amplification function. Here, the appropriate driving microwave refers to obtaining sufficient gain without generating significant heat and noise.

Figure 9:
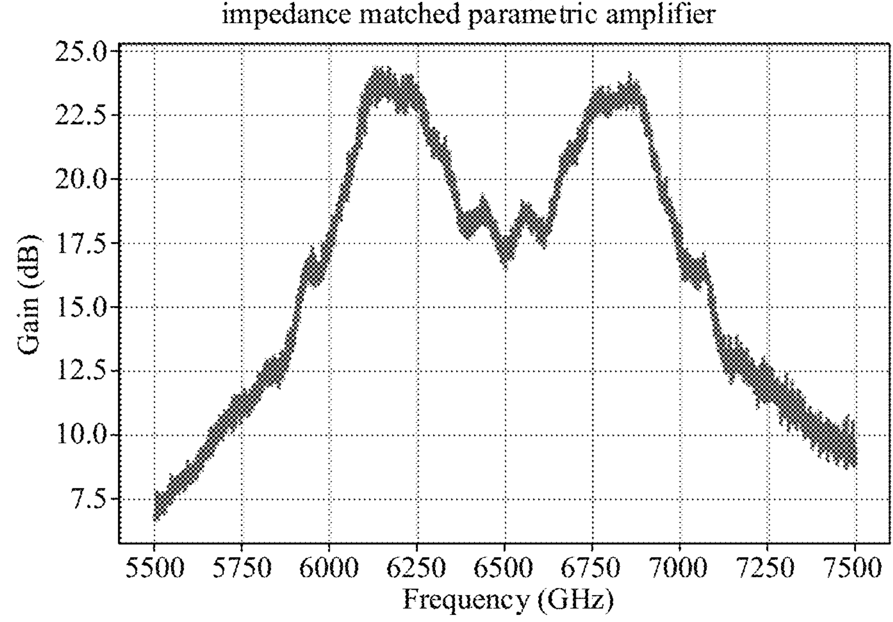
FIG. 9 is a schematic diagram of a test effect of a superconducting impedance matched parametric amplifier in an embodiment of this disclosure.

Referring to FIG. 9, FIG. 9 is a schematic diagram of a test effect of a superconducting impedance matched parametric amplifier in an embodiment of this disclosure. The maximum available bandwidth of the amplifier implementing the parametric amplification function in related technologies is only about 600 MHz. However, as shown in FIG. 9, the peak of the available bandwidth of the superconducting impedance matched parametric amplifier provided in the embodiment of this disclosure is 1 GHZ, and the performance of the conducting impedance matched parametric amplifier is better. Moreover, the loss of the superconducting impedance matched parametric amplifier is reduced. As shown in FIG. 9, in the process that the maximum available bandwidth of the superconducting impedance matched parametric amplifier increases from 5500 GHz to 7500 GHz, the maximum loss value of the superconducting impedance matched parametric amplifier is 24 dB, and decreases to 8 dB at 7500 GHz.

This disclosure determines, on the basis of parameters of an environment in which a quantum chip is used, a center wavelength parameter, a gain parameter and a bandwidth parameter of the superconducting impedance matched parametric amplifier; calculates, on the basis of the wavelength parameter, the gain parameter and the bandwidth parameter, an impedance value of an impedance matching line of the superconducting impedance matched parametric amplifier and a capacitance value of the amplifier; calculates, on the basis of the impedance value of the impedance matching line, a line width dimension of a coplanar waveguide of the superconducting impedance matched parametric amplifier; calculates, on the basis of the impedance value of the impedance matching line and the capacitance value of the amplifier, a stub dimension of the superconducting impedance matched parametric amplifier; and determines, on the basis of the line width dimension and the stub dimension, structural parameters of the superconducting impedance matched parametric amplifier. Therefore, it can be achieved that: 1) by way of the method for determining a superconducting impedance matched parametric amplifier provided by this disclosure, it is possible to better improve performances of a conducting impedance matched parametric amplifier, and reduce the loss of the conducting impedance matched parametric amplifier; and 2) moreover, by way of the structure of the superconducting impedance matched parametric amplifier, during manufacturing of the conducting impedance matched parametric amplifier, the yield is higher, and the manufacturing cost is lowered, thereby facilitating popularizing superconducting quantum chips in a large scale.

One or more modules, submodules, and/or units of the apparatus can be implemented by processing circuitry, software, or a combination thereof, for example. The term module (and other similar terms such as unit, submodule, etc.) in this disclosure may refer to a software module, a hardware module, or a combination thereof. A software module (e.g., computer program) may be developed using a computer programming language and stored in memory or non-transitory computer-readable medium. The software module stored in the memory or medium is executable by a processor to thereby cause the processor to perform the operations of the module. A hardware module may be implemented using processing circuitry, including at least one processor and/or memory. Each hardware module can be implemented using one or more processors (or processors and memory). Likewise, a processor (or processors and memory) can be used to implement one or more hardware modules. Moreover, each module can be part of an overall module that includes the functionalities of the module. Modules can be combined, integrated, separated, and/or duplicated to support various applications. Also, a function being performed at a particular module can be performed at one or more other modules and/or by one or more other devices instead of or in addition to the function performed at the particular module. Further, modules can be implemented across multiple devices and/or other components local or remote to one another. Additionally, modules can be moved from one device and added to another device, and/or can be included in both devices.

The description above is only examples of embodiments of this disclosure and not intended to limit the scope of this disclosure. Any modification, equivalent replacement, improvement, etc. made within the spirit and principle of this disclosure shall fall within the scope of protection of this disclosure.

What is claimed is:

1. A method for determining a superconducting impedance matched parametric amplifier, the method comprising:

determining a center wavelength parameter, a gain parameter, and a bandwidth parameter of the superconducting impedance matched parametric amplifier based on an operating environment of a quantum chip;

determining an impedance value of an impedance matching line of the superconducting impedance matched parametric amplifier and a capacitance value of the amplifier based on the wavelength parameter, the gain parameter, and the bandwidth parameter as constraints;

calculating a line width dimension of a coplanar waveguide of the superconducting impedance matched parametric amplifier based on the impedance value of the impedance matching line;

calculating a stub dimension of the superconducting impedance matched parametric amplifier based on the impedance value of the impedance matching line and the capacitance value of the amplifier; and determining structural parameters of the superconducting impedance matched parametric amplifier based on the line width dimension and the stub dimension.

2. The method according to claim 1, further comprising:

adjusting, when the impedance value of the impedance matching line decreases, a shape of the coplanar waveguide of the superconducting impedance matched parametric amplifier into a curved state.

3. The method according to claim 2, further comprising:

calculating a room temperature resistance value of a Josephson junction of the superconducting impedance matched parametric amplifier based on the capacitance value of the amplifier and a center frequency of the superconducting impedance matched parametric amplifier.

4. The method according to claim 1, further comprising:

configuring a target port for accessing a pump signal for the superconducting impedance matched parametric amplifier, the target port being configured to indicate an operating point of the superconducting impedance matched parametric amplifier.

5. The method according to claim 1, wherein the determining the center wavelength parameter, the gain parameter, and the bandwidth parameter comprises:

determining the center wavelength parameter, the gain parameter, and the bandwidth parameter of the superconducting impedance matched parametric amplifier based on a plurality of parameters of the operating environment of the quantum chip.

6. The method according to claim 5, wherein the plurality of parameters includes at least one of a read frequency parameter or a gain parameter.

7. The method according to claim 6, wherein the plurality of parameters includes the read frequency parameter, the read frequency parameter being based on a bandwidth range of a cavity of the quantum chip.

8. An apparatus for determining a superconducting impedance matched parametric amplifier, the apparatus comprising:

processing circuitry configured to:

determine a center wavelength parameter, a gain parameter, and a bandwidth parameter of the superconducting impedance matched parametric amplifier based on an operating environment of a quantum chip;

determine an impedance value of an impedance matching line of the superconducting impedance matched parametric amplifier and a capacitance value of the amplifier based on the wavelength parameter, the gain parameter, and the bandwidth parameter as constraints;

calculate a line width dimension of a coplanar waveguide of the superconducting impedance matched parametric amplifier based on the impedance value of the impedance matching line;

calculate a stub dimension of the superconducting impedance matched parametric amplifier based on the impedance value of the impedance matching line and the capacitance value of the amplifier; and determine structural parameters of the superconducting impedance matched parametric amplifier based on the line width dimension and the stub dimension.

9. The apparatus according to claim 8, wherein the processing circuitry is configured to:

adjust, when the impedance value of the impedance matching line decreases, a shape of the coplanar waveguide of the superconducting impedance matched parametric amplifier into a curved state.

10. The apparatus according to claim 9, wherein the processing circuitry is configured to:

calculate a room temperature resistance value of a Josephson junction of the superconducting impedance matched parametric amplifier based on the capacitance value of the amplifier and a center frequency of the superconducting impedance matched parametric amplifier.

11. The apparatus according to claim 8, wherein the processing circuitry is configured to:

configure a target port for accessing a pump signal for the superconducting impedance matched parametric amplifier, the target port being configured to indicate an operating point of the superconducting impedance matched parametric amplifier.

12. The apparatus according to claim 8, wherein the processing circuitry is configured to:

determine the center wavelength parameter, the gain parameter, and the bandwidth parameter of the superconducting impedance matched parametric amplifier based on a plurality of parameters of the operating environment of the quantum chip.

13. The apparatus according to claim 12, wherein the plurality of parameters includes at least one of a read frequency parameter or a gain parameter.

14. The apparatus according to claim 13, wherein the plurality of parameters includes the read frequency parameter, the read frequency parameter being based on a bandwidth range of a cavity of the quantum chip.

15. A non-transitory computer-readable storage medium, storing instructions which when executed by at least one processor cause the at least one processor to perform:

determining a center wavelength parameter, a gain parameter, and a bandwidth parameter of a superconducting impedance matched parametric amplifier based on an operating environment of a quantum chip;

determining an impedance value of an impedance matching line of the superconducting impedance matched parametric amplifier and a capacitance value of the amplifier based on the wavelength parameter, the gain parameter, and the bandwidth parameter as constraints;

calculating a line width dimension of a coplanar waveguide of the superconducting impedance matched parametric amplifier based on the impedance value of the impedance matching line;

calculating a stub dimension of the superconducting impedance matched parametric amplifier based on the impedance value of the impedance matching line and the capacitance value of the amplifier; and determining structural parameters of the superconducting impedance matched parametric amplifier based on the line width dimension and the stub dimension.

16. The non-transitory computer-readable storage medium according to claim 15, wherein the instructions further cause the at least one processor to perform:

adjusting, when the impedance value of the impedance matching line decreases, a shape of the coplanar waveguide of the superconducting impedance matched parametric amplifier into a curved state.

17. The non-transitory computer-readable storage medium according to claim 16, wherein the instructions further cause the at least one processor to perform:

calculating a room temperature resistance value of a Josephson junction of the superconducting impedance matched parametric amplifier based on the capacitance value of the amplifier and a center frequency of the superconducting impedance matched parametric amplifier.

18. The non-transitory computer-readable storage medium according to claim 15, wherein the instructions further cause the at least one processor to perform:

configuring a target port for accessing a pump signal for the superconducting impedance matched parametric amplifier, the target port being configured to indicate an operating point of the superconducting impedance matched parametric amplifier.

19. The non-transitory computer-readable storage medium according to claim 15, wherein the determining the center wavelength parameter, the gain parameter, and the bandwidth parameter comprises:

determining the center wavelength parameter, the gain parameter, and the bandwidth parameter of the superconducting impedance matched parametric amplifier based on a plurality of parameters of the operating environment of the quantum chip.

20. The non-transitory computer-readable storage medium according to claim 19, wherein the plurality of parameters includes at least one of a read frequency parameter or a gain parameter.

* * * * *